United States Patent
Park et al.

(10) Patent No.: US 6,458,656 B1
(45) Date of Patent: Oct. 1, 2002

(54) PROCESS FOR CREATING A FLASH MEMORY CELL USING A PHOTORESIST FLOW OPERATION

(75) Inventors: Stephen K. Park, Austin, TX (US); George Jon Kluth, Sunnyvale, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 37 days.

(21) Appl. No.: 09/628,130

(22) Filed: Jul. 28, 2000

Related U.S. Application Data
(60) Provisional application No. 60/189,803, filed on Mar. 16, 2000.

(51) Int. Cl.$^7$ ............................................. H01L 21/336
(52) U.S. Cl. ........................ 438/257; 438/527; 438/593; 438/954; 438/525
(58) Field of Search ................... 438/197, 216, 438/257, 287, 525, 591, 593, 954, 527, 261, 275, 276, 289, 290, 297, 298, 439, 449, 451, 514, 524

(56) References Cited

U.S. PATENT DOCUMENTS

| | | | | |
|---|---|---|---|---|
| 4,311,533 A | * | 1/1982 | Roche | 438/373 |
| 5,395,781 A | * | 3/1995 | Wilhoit | 257/327 |
| 5,464,785 A | * | 11/1995 | Hong | 438/264 |
| 6,127,098 A | * | 10/2000 | Nakagawa et al. | 430/315 |
| 6,281,094 B1 | * | 8/2001 | Abiko et al. | 438/433 |

OTHER PUBLICATIONS

Chang et al, ULSI Technology, McGraw–Hill, 1996, pp. 260, 510.*
Bloom, Ilan, "Sharp Reduction of Memory Cell Area", Nikkei Microdevices LSI Seminar, Tokyo, Dec. 1999.
U.S. patent application Ser. No. 09/627,567: "Use of an Etch to Reduce the Thickness and Round the Edges of a Resist Mask During the Creation of a Memory Cell"; Inventors: Bharath Rangarajan, Fei Wang, George J. Kluth, and Ursula Q. Quinto; Filed: Jul. 28, 2000; Attorney Docket No. 9076/447.
U.S. patent application Ser. No. 09/668,051: "Use of an Etch Mask to Remove the Edges of a Resist Mask During the Creation of a Memory Cell"; Inventors: Mark T. Ramsbey, Tuan Pham, Mark Chang; Filed: Sep. 21, 2000; Attorney Docket No. 9076/471.

* cited by examiner

*Primary Examiner*—Matthew Smith
*Assistant Examiner*—Craig P. Lytle
(74) *Attorney, Agent, or Firm*—Amin & Turocy, LLP

(57) ABSTRACT

A process for fabricating a memory cell in a two-bit EEPROM device, the process includes forming an ONO layer overlying a semiconductor substrate, depositing a resist mask overlying the ONO layer, patterning the resist mask, implanting the semiconductor substrate with an n-type dopant, wherein the resist mask is used as an ion implant mask, and performing a resist flow operation on the semiconductor substrate after implanting the semiconductor substrate with an n-type dopant. In one preferred embodiment, the resist flow operation on the semiconductor substrate includes baking the semiconductor substrate in an oven at about 100° C. to about 300° C. for about 5 minutes to about 30 minutes to thin down the resist mask and cause the edges of the resist mask to become rounded.

17 Claims, 3 Drawing Sheets

PROCESS FOR CREATING A FLASH MEMORY CELL USING A PHOTORESIST FLOW OPERATION

CROSS-REFERENCE TO RELATED APPLICATION

This application claims the benefit under 35 U.S.C. §119 (e) of the U.S. provisional application Ser. No. 60/189,803, filed on Mar. 16, 2000.

CROSS REFERENCE TO RELATED APPLICATIONS

Related subject matter is disclosed in commonly-assigned, co-pending patent applications entitled "USE OF AN ETCH TO REDUCE THE THICKNESS AND ROUND THE EDGES OF A RESIST MASK DURING THE CREATION OF A MEMORY CELL" Ser. No. 09/627,567, and "USE OF AN ETCH TO ROUND THE EDGES OF A RESIST MASK DURING THE CREATION OF A MEMORY CELL" Ser. No. 09/668,051, both cases filed on even date herewith.

1. Field of the Invention

This invention relates generally to non-volatile memory devices. In particular, the present invention relates to a method and process for manufacturing a non-volatile memory device.

2. Background of the Invention

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state. Data resides in a certain logic state on the floating-gate electrode. During a read operation, selected data from a selected floating-gate electrode can be output to an external communication unit using a bit-line.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gateelectrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) layer. During programming, electrical charge is transferred from the substrate to the silicon nitride layer in the ONO layer. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in regions within a single continuous silicon nitride layer.

Non-volatile memory designers have taken advantage of the localized nature of electron storage within a silicon nitride layer and have designed memory devices that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, fabricating the p-type and n-type regions within a memory cell presents several challenges. Sometimes, in the fabrication of a memory cell, an ONO layer is formed having a first silicon dioxide layer overlying the semiconductor substrate, a silicon nitride layer overlying the first silicon dioxide layer, and a second silicon dioxide layer overlying the silicon nitride layer. A layer of photo resist is then spun on the ONO layer. The photoresist is patterned into a resist mask and the semiconductor substrate is doped with a p-type dopant such as boron using ion implantation at a large angle of incidence relative to the principal surface of the semiconductor substrate to allow the p-type implant to be located away from a subsequent n-type dopant. The wafer is then rotated 180° and the semiconductor substrate is doped a second time with a p-type dopant using ion implantation at a large angle of incidence relative to the principal surface of the semiconductor substrate. Doping the semiconductor substrate with a p-type dopant creates p-type regions. The semiconductor substrate is then doped with an n-type dopant such as arsenic using ion implantation at an angle substantially normal to the principal surface of the semiconductor substrate. Doping the semiconductor substrate with n-type dopants creates n-type regions. Typically, the ONO layer is etched before the semiconductor substrate is doped with n-type dopants in order to make the implant of n-type dopants a more controlled implant. Once the n-type dopants have been implanted in the semiconductor substrate, the resist mask is stripped and cleaned from the ONO layer and a bit-line oxide region is thermally grown onto the semiconductor substrate.

There are several problems that occur with the above-described prior art method for fabricating a memory cell. One problem is that the resist mask has to meet two conflicting requirements: the resist mask has to be thin enough to accommodate the large angle of incidence of the p-type implant, and yet the resist mask has to be thick enough to withstand the n-type implant. If the resist mask is too thick, the p-type implant must be made with a smaller angle of incidence, however if the resist mask is too thin the n-type implant cannot be made at all because the resist mask would have been too heavily degraded. Accordingly, advances in memory cell fabrication technology are necessary to insure patterning of high density memory cells used in two-bit EEPROM devices.

BRIEF SUMMARY

The present invention is for a process for fabricating a memory cell in a non-volatile memory device, preferably in a two-bit EEPROM device. Fabrication of a two-bit EEPROM device having a memory cell requires the formation of p-type regions and n-type regions with good critical dimension control. This is because proper functionality of the two-bit EEPROM device during a programming operation requires voltages to be applied to the p-type regions and n-type regions. In particular, the p-type regions must be positioned at the edges of the ONO layer for fabrication of high density devices. However, fabrication of high density devices with p-type regions positioned at the edges of the ONO layer is hard to obtain due to the limitations of the resist mask. By fabricating a high quality memory cell using a resist flow operation, a high-density two-bit EEPROM device with good critical dimensions control can be manufactured.

In one form, a process for fabricating a memory cell includes providing a semiconductor substrate and forming an ONO layer over the semiconductor substrate. A layer of photoresist is then deposited overlying the ONO layer and patterned into a resist mask. The resist mask is thick enough to withstand an n-type implant. Preferably, the ONO layer is etched before the semiconductor substrate is doped with n-type dopants in order to make the implant of n-type dopants a more controlled implant, however, the ONO layer may be etched after the semiconductor substrate is doped with n-type dopants. The semiconductor substrate is then doped with an n-type dopant such as arsenic, preferably by using ion implantation. The doping of the semiconductor substrate with an n-type dopant causes n-type regions to form in the semiconductor substrate. Preferably, the n-type implant is a direct implant, which is an implant at an angle substantially normal with respect to the principal surface of the semiconductor surface.

After doping the semiconductor substrate with n-type dopants, a resist flow operation is performed on the semiconductor substrate by placing the semiconductor substrate in an oven. The resist flow operation thins down the resist mask and causes the corners of the resist mask to become rounded. Once the resist flow operation is performed, the semiconductor substrate is doped with p-type dopants such as boron, preferably by using ion implantation. The p-type implant is an angled implant, which is an implant at an angle substantially acute with respect to the principal surface of the semiconductor substrate. The doping of the semiconductor substrate with p-type dopants causes p-type regions to form in the semiconductor substrate. After doping the semiconductor substrate with p-type dopants the resist mask is removed and the bit-line oxide region is formed. The rounded corners and thinness of the resist mask allow for a more angled p-type implant. The more angled p-type implant allows for the fabrication of a memory cell having p-type regions positioned at the edges of the ONO layer.

Figure 1:
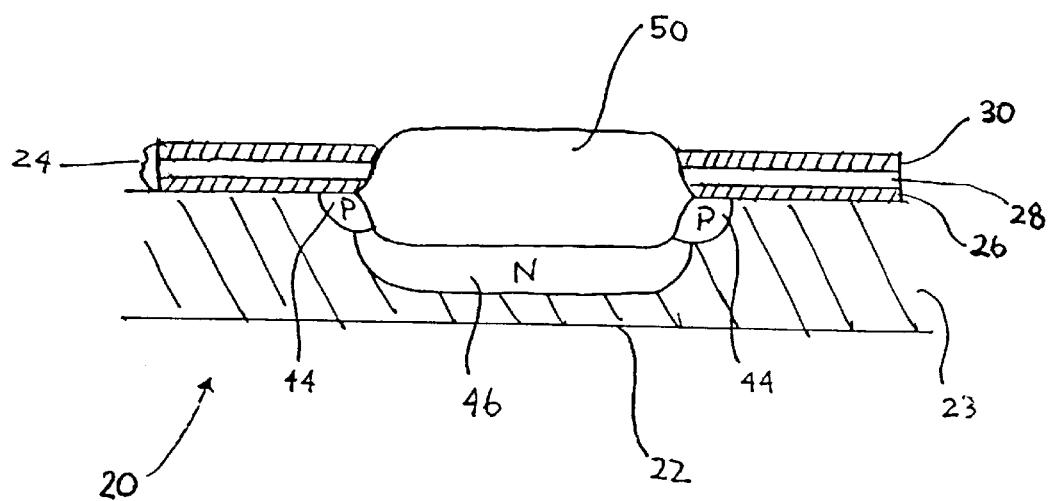
FIG. 1 illustrates, in cross-section, a portion of a memory cell containing p-type regions, in accordance with one preferred embodiment of the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is memory cell 20 suitable for use in a two-bit EEPROM device. Please note that while all the FIGS. 1–6, illustrate only one memory cell 20, a two-bit EEPROM device may have many more memory cells identical to memory cell 20. For the sake of clarity, these additional memory cells have been left out of FIGS. 1–6.

Memory cell 20 includes p-type regions 44 and n-type regions 46 located in semiconductor substrate 22 and separated by channel region 23, as illustrated in FIG. 1. Bit-line oxide region 50 overlies p-type regions 44 and n-type regions 46, respectively. Oxide-nitride-oxide (ONO) layer 24 includes first silicon dioxide layer 26 overlying channel region 23. Silicon nitride layer 28 overlies first silicon dioxide layer 26. Second silicon dioxide layer 30 overlies silicon nitride layer 28. In the operation of memory cell 20, data resides in a certain logic state on memory cell 20. During a read operation, selected data from a selected memory cell 20 can be output to an external communication unit by using n-type regions 46. Those skilled in the art will recognize that in order to create higher density memory cells 20, p-type regions 44 and n-type regions 46 must be formed with great accuracy. In order to form p-type regions 44 with great accuracy, the resist mask has to be thin enough to accommodate the large angle of incidence of the p-type implant, and yet the resist mask has to be thick enough to withstand the n-type implant.

Figure 2:
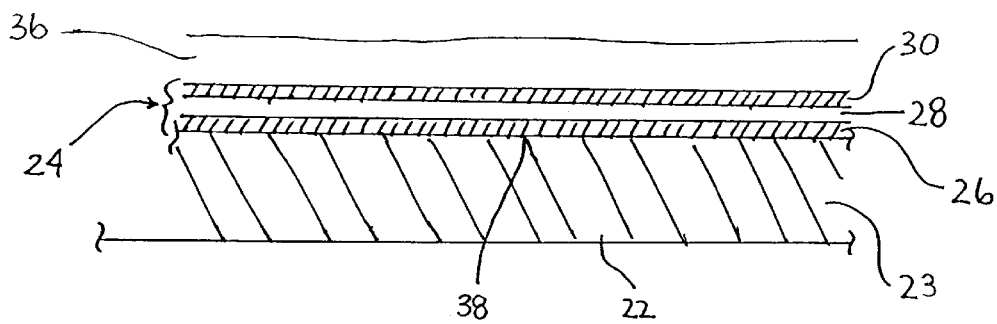
FIGS. 2–6 illustrate, in cross-section, process steps for the fabrication of a memory cell, in accordance with one preferred embodiment of the invention.

Referring to FIG. 2, ONO layer 24 is formed overlying the surface of semiconductor substrate 22. Preferably, semiconductor substrate 22 is a single crystal silicon substrate. Semiconductor substrate 22 has principal surface 38 previously processed and cleaned to remove debris and native oxides. Preferably, ONO layer 24 comprises first silicon dioxide layer 26, silicon nitride layer 28, and second silicon dioxide layer 30. First silicon dioxide layer 26 is formed overlying the semiconductor substrate 22. Preferably, first silicon dioxide layer 26 has a thickness of about 50 to about 150 angstroms and, more preferably, a thickness of about 80 angstroms. After forming first silicon dioxide layer 26, silicon nitride layer 28 is deposited overlying first silicon dioxide layer 26, as illustrated in FIG. 2. Preferably, silicon nitride layer 28 is formed by reacting ammonia $NH_3$ with either dichlorosilane ($SiCl_2H_2$) or silane ($SiH_4$). Preferably, silicon nitride layer 28 is deposited overlying first silicon dioxide layer 26 having an initial thickness of about 120 to about 150 angstroms and, more preferably, an initial thickness of about 135 angstroms. After depositing silicon nitride layer 28, second silicon dioxide layer 30 is formed overlying silicon nitride layer 28, as illustrated in FIG. 2. As second silicon dioxide layer 30 is formed overlying silicon nitride layer 28, silicon nitride layer 28 decreases in thickness to a final thickness of about 50 to about 80 angstroms and, more preferably, a final thickness of about 60 angstroms. Preferably, second silicon dioxide layer 30 has a thickness of about 50 to about 150 angstroms and, more preferably, a thickness of about 80–95 angstroms.

Figure 3:
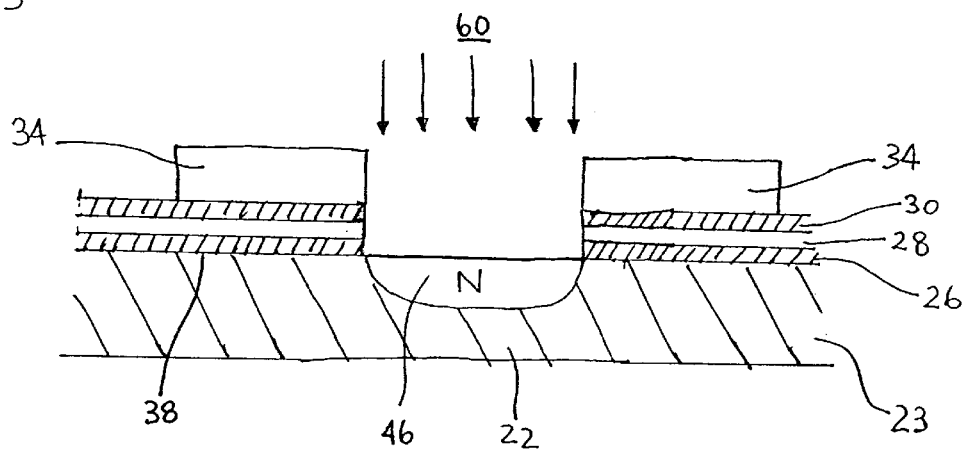

Once ONO layer 24 has been formed, photoresist layer 36 is deposited overlying ONO layer 24. Photoresist layer 36, and resist mask 34, comprise any material known to one of ordinary skill in the art that can be used as a photoresist. In one preferred embodiment, photoresist layer 36 and resist mask 34 comprise UV5 photoresist manufactured by Tokyo Electron specifically for 0.25 micron process technology. Photoresist layer 36 must be thick enough to withstand the doping of semiconductor substrate 22 with n-type dopants. Preferably, photoresist layer 36 has a thickness of about 0.50 microns to about 2.0 microns and, more preferably, a thickness of about 1.0 microns. After photoresist 36 has been deposited, photoresist layer 36 is patterned into resist mask 34, as illustrated in FIG. 3. Preferably, photoresist layer 36 is exposed to a light source, such as an x-ray source, which allows for the patterning of photoresist layer 36 into resist mask 34.

Once photoresist layer 36 has been patterned, semiconductor substrate 22 is then doped with an n-type dopant using resist mask 34 as a doping mask. Preferably, n-type dopant comprises an element selected from the group consisting of antimony, arsenic, and phosphorus. Preferably, semiconductor substrate 22 is doped with arsenic. In one preferred embodiment of this invention, the semiconductor substrate 22 is doped with an n-type dopant, such as arsenic, by using ion implantation. Ion implantation allows for the fabrication of memory cell 20 with higher density and smaller feature sizes. Using resist mask 34 as an ion implant mask, n-type implant 60 is then performed, as illustrated in FIG. 3. The n-type implant 60 is preferably arsenic implanted at a dose of about $1\times10^{14}$ $cm^{-2}$ to about $1\times10^{16}$ $cm^{-2}$ at an implant energy of about 20 KeV to about 80 KeV. In one preferred embodiment, n-type implant 60 is performed through ONO layer 24, but is masked out by resist mask 34. The n-type implant is preferably a direct implant performed at an angle substantially normal to the principal surface 38 of the semiconductor substrate 22, such as about a 90° angle, as illustrated in FIG. 3. The n-type implant 60 provides a high breakdown voltage for the drain node, which is needed during cell erasure. The n-type implant 60 also forms the buried bit-line, which is a sub-surface conductive channel that carries a signal to each bit in the memory cell 20.

In one preferred embodiment, ONO layer 24 is etched to expose part of the semiconductor substrate 22 before semiconductor substrate 22 is doped with n-type dopants in order to make n-type implant 60 a more controlled implant, as illustrated in FIG. 3. Preferably, ONO layer is etched before semiconductor substrate 22 is doped with n-type dopants, however ONO layer may be etched after semiconductor substrate 22 is doped with n-type dopants. Preferably a blanket anisotropic etch is performed to expose part of the semiconductor substrate 22, as illustrated in FIG. 3. In one preferred embodiment, the blanket anisotropic etch is performed using an etch comprising a gas selected from the group consisting of $CF_4$ and $CHF_3$.

Figure 4:
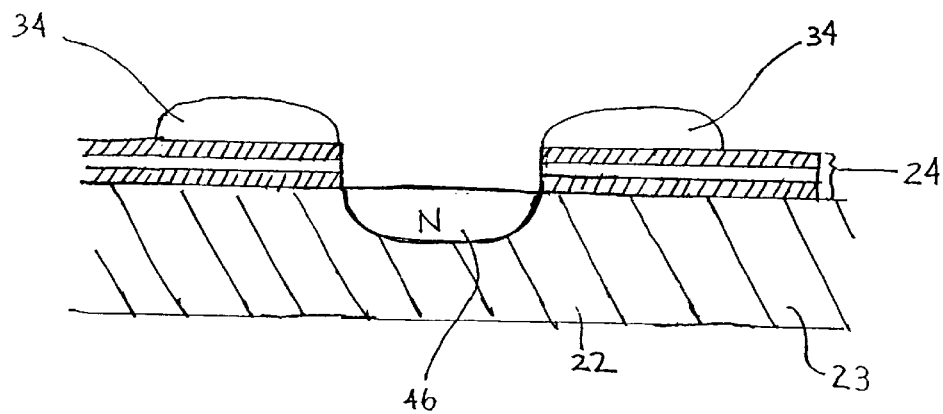

Once semiconductor substrate 22 has been doped with an n-type dopant, forming n-type regions 46, a resist flow operation is performed on semiconductor substrate 22 by baking semiconductor substrate 22 in an oven. The resist flow operation thins down resist mask 34 and causes the corners of resist mask 34 to become rounded, as illustrated in FIG. 4. The resist flow operation can be performed in any oven known to one of ordinary skill in the art, such as an RTA furnace and a tunnel oven. In one preferred embodiment, semiconductor substrate 22 is baked in a tunnel oven at a temperature of between about 100° C. to about 300° C. for about 5 minutes to about 30 minutes, and more preferably about 200° C. for about 10 minutes. In one preferred embodiment, semiconductor substrate 22 is baked in an RTA furnace at a temperature of between about 100° C. to about 300° C. for about 10 seconds to about 1 minute.

Figure 5:
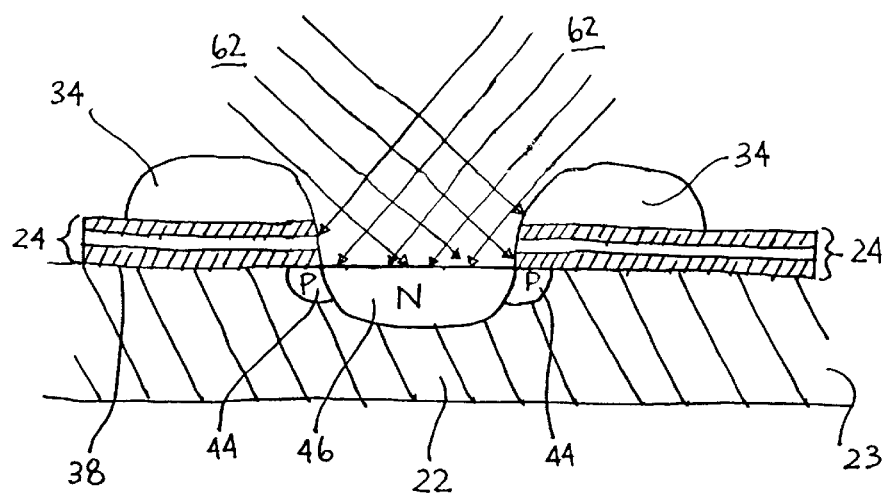

Once a resist flow operation is performed on semiconductor substrate 22, semiconductor substrate 22 is doped with a p-type dopant, as illustrated in FIG. 5. In one preferred embodiment of this invention, semiconductor substrate 22 is doped with a p-type dopant by using ion implantation. Preferably, the p-type dopant comprises boron. Using the same resist mask 34 as an ion implant mask, p-type implant 62 is performed to fix the threshold voltage of the select transistor, as illustrated in FIG. 5. The p-type implant 62 is preferably boron implanted at a dose of about $1\times10^{12} cm^{-2}$ to about $1\times10^{14} cm^{-2}$ at an implant energy of about 20 KeV to about 80 KeV. In one preferred embodiment, the p-type implant 62 is performed directly onto semiconductor substrate 22, but is masked out by resist mask 34, as illustrated in FIG. 5. Preferably, the p-type implant 62 is an angled implant, that is, an implant at an angle acute with respect to the principal surface of the semiconductor substrate. If a resist flow operation is performed on semiconductor substrate 22 to thin down resist mask 34 and cause the edges of resist mask 34 to become rounded, p-type implant 62 can be performed at an angle substantially acute with respect to the principal surface of the semiconductor substrate 22, such as at an angle of about 7° to about 60° with respect to the principal surface of the semiconductor substrate 22, and more preferably at an angle of about 30° with respect to the principal surface of the semiconductor substrate 22.

Figure 6:
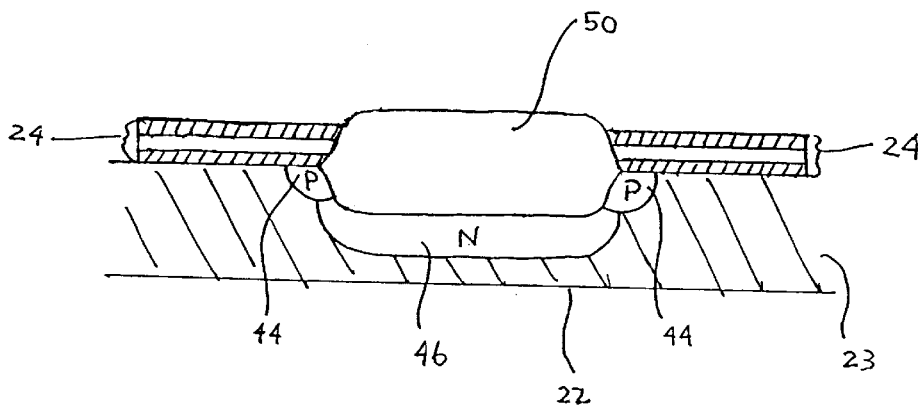

Once semiconductor substrate 22 has been doped with n-type and p-type dopants, resist mask 34 is stripped and cleaned from ONO layer 24 and bit-line oxide region 50 is formed overlying the exposed semiconductor substrate 22, as illustrated in FIG. 6. Preferably, bit-line oxide region 50 is formed by thermally growing a layer of silicon dioxide into and on top of the exposed semiconductor substrate 22, however bit-line oxide region 50 can be formed by any one of a number of methods for growing oxide known to one of ordinary skill in the art, such as high-pressure oxidation, or rapid thermal processing.

Thus, there has been disclosed in accordance with the invention, a process for fabricating a memory cell using a resist mask that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A process for fabricating a memory cell comprising:
    depositing a resist mask overlying an ONO layer, the ONO layer formed over a semiconductor substrate having a principal surface;
    patterning the resist mask;
    doping the semiconductor substrate with an n-type dopant,
    performing a resist flow operation on the semiconductor substrate after the doping of the semiconductor substrate with the n-type dopant, wherein the performing of the resist flow operation on the semiconductor substrate comprises baking the semiconductor substrate in an oven to thin down the resist mask and to cause the edges of the resist mask to become rounded; and
    doping the semiconductor substrate with a p-type dopant after the performing of the resist flow operation on the semiconductor substrate.

2. The process of claim 1, wherein the semiconductor substrate is baked in an oven at about 100° C. to about 300° C. for about 30 minutes.

3. The process of claim 1, wherein the doping the semiconductor substrate with a p-type dopant comprises implanting the semiconductor substrate with a p-type dopant at an angle substantially acute with respect to the principal surface of the semiconductor substrate.

4. The process of claim 3, wherein the implanting of the semiconductor substrate with a p-type dopant is performed at an angle of about 7° to about 60° with respect to the principal surface of the semiconductor substrate.

5. The process of claim 3, wherein the doping of the semiconductor substrate with an n-type dopant comprises implanting the semiconductor substrate with an n-type dopant at an angle substantially normal to the principal surface of the semiconductor substrate.

6. The process of claim 5 further comprising:
    etching the ONO layer to expose part of the semiconductor substrate;
    removing the resist mask; and
    forming a bit-line oxide region overlying the exposed semiconductor substrate.

7. A process for making an electronic component comprising:
    forming a memory cell by the process of claim 1; and
    forming the electronic component comprising the memory cell.

8. A process for fabricating a two-bit flash memory cell comprising the steps of:
    depositing a resist mask overlying an ONO layer, the ONO layer is formed over a semiconductor substrate having a principal surface, and the ONO layer has a first silicon dioxide layer overlying the semiconductor substrate, a silicon nitride layer overlying the first silicon dioxide layer, and a second silicon dioxide layer overlying the silicon nitride layer;
    patterning the resist mask;
    implanting the semiconductor substrate with a n-type dopant at an angle substantially normal to the principal surface of the semiconductor substrate, wherein the resist mask is used as an ion implant mask;
    performing a resist flow operation on the semiconductor substrate to thin down the resist mask and cause the edges of the resist mask to become rounded; and
    implanting the semiconductor substrate with a p-type dopant, wherein the resist mask is used as an ion implant mask.

9. The process of claim 8, wherein the step of implanting the semiconductor substrate with a p-type dopant comprises the step of implanting the semiconductor substrate with a p-type dopant at an angle substantially acute with respect to the principal surface of the semiconductor substrate.

10. The process of claim 8, wherein the step of performing the resist flow operation on the semiconductor substrate comprises the step of baking the semiconductor substrate in an RTA furnace at about 100° C. to about 300° C. for about 10 seconds to about 1 minute to thin down the resist mask and cause the edges of the resist mask to become rounded.

11. The process of claim 8 further comprising the steps of:
    etching the ONO layer to expose part of the semiconductor substrate before implanting the semiconductor substrate with an n-type dopant;
    removing the resist mask; and
    forming a bit-line oxide region overlying the exposed semiconductor substrate.

12. A process for fabricating a memory cell comprising:
    patterning a resist mask overlying an ONO layer, the ONO layer formed over a semiconductor substrate having a principal surface, the ONO layer having a first silicon dioxide layer overlying the semiconductor substrate, a silicon nitride layer overlying the first silicon dioxide layer, and a second silicon dioxide layer overlying the silicon nitride layer;
    doping the semiconductor substrate with an n-type dopant;
    performing a resist flow operation on the semiconductor substrate to thin down the resist mask and cause the edges of the resist mask to become rounded;
    etching the ONO layer to expose part of the semiconductor substrate;

removing the resist mask; and forming a bit-line oxide region overlying the exposed semiconductor substrate.

13. The process of claim 12, wherein the performing of the resist flow operation on the semiconductor substrate comprises baking the semiconductor substrate in an oven at about 100° C. to about 300° C. for about 5 minutes to about 30 minutes to thin down the resist mask and cause the edges of the resist mask to become rounded.

14. The process of claim 12, wherein the resist mask has a thickness of about 5000 to about 20,000 angstroms.

15. The process of claim 12 further comprising implanting the semiconductor substrate with a p-type dopant at an angle substantially acute with respect to the principal surface of the semiconductor substrate after the performing of the resist flow operation on the semiconductor substrate.

16. The process of claim 15, wherein the implanting of the semiconductor substrate with a p-type dopant is performed at an angle of about 7° to about 45° with respect to the principal surface of the semiconductor substrate.

17. The process of claim 12, wherein the performing of the resist flow operation on the semiconductor substrate comprises baking the semiconductor substrate in an RTA furnace at about 100° C. to about 300° C. for about 10 seconds to about 1 minute to thin down the resist mask and cause the edges of the resist mask to become rounded.

* * * * *